United States Patent [19]

Suzuki et al.

[11] Patent Number: 4,873,175

[45] Date of Patent: Oct. 10, 1989

[54] METHOD OF FORMING FUNCTIONAL COATING FILM BETWEEN FINE ELECTRIC CONDUCTIVE CIRCUITS

[75] Inventors: Tameyuki Suzuki, Kanagawa; Takuro Kamakura, Chiba, both of Japan

[73] Assignee: Shinto Paint Co., Ltd., Amagasaki, Japan

[21] Appl. No.: 947,332

[22] Filed: Dec. 29, 1986

[30] Foreign Application Priority Data

Jan. 8, 1986 [JP] Japan .................................. 61-1534

[51] Int. Cl.$^4$ .............................................. G03C 5/00
[52] U.S. Cl. .................................... 430/311; 430/20; 430/325
[58] Field of Search .............. 430/311, 322, 324, 325, 430/327, 4; 350/334, 336, 339 F, 339 R

[56] References Cited

U.S. PATENT DOCUMENTS

| 4,311,773 | 1/1982 | Kaneko et al. | 430/325 |
| 4,369,247 | 1/1983 | Goff et al. | 430/311 |
| 4,617,094 | 10/1986 | Kamamori et al. | 204/18.1 |
| 4,812,387 | 3/1989 | Suzuki et al. | 430/311 |

FOREIGN PATENT DOCUMENTS

| 34522 | 2/1982 | Japan | 430/20 |
| 91303 | 5/1985 | Japan | 430/4 |
| 114807 | 6/1985 | Japan | 430/4 |
| 43729 | 3/1986 | Japan | 430/20 |

*Primary Examiner*—José Dees
*Attorney, Agent, or Firm*—Armstrong, Nikaido Marmelstein Kubovcik & Murray

[57] ABSTRACT

The present invention is for a method of forming a coating film used for filling the space between the color stripes for a color filter which is used for colorization of a liquid crystal display. In particular, the light-shielding electrodeposition coating is first formed in a transparent electric conductive circuit pattern so as to suppress the reaction of a photo-setting material against light which is to be applied to the electrodeposition coating.

3 Claims, No Drawings

METHOD OF FORMING FUNCTIONAL COATING FILM BETWEEN FINE ELECTRIC CONDUCTIVE CIRCUITS

FIELD OF THE INVENTION

The present invention relates to a method of forming a coating film which has a light-shielding property on the spaces between fine electric conductive patterns on a transparent base board. More particularly, the present invention relates to a method which is useful for forming a coating film used for filling the space between the color stripes for a color filter which is used for colorization of a liquid crystal display so as to screen unnecessary light and to improve other properties.

BACKGROUND OF THE INVENTION

A method adopting a printing technique such as a silk screening method, an offset method, or a photolithography method, which require very complicated processes have conventionally been known as methods useful for forming a functional coating film for filling the spaces between the color stripes of a color filter which is used for colorization of a liquid crystal display in order to screen unnecessary light and improve other properties.

Among such conventional methods, however, a method using a printing technique is only adaptable to a film with low accuracy, for example, having such a coarse space as at least 100μ. Although a method utilizing a photolithography is more accurate than a printing method, it is a complicated and expensive process which greatly limits the possibility of being put to practical use.

SUMMARY OF THE INVENTION

The while studying the prior art, the present inventors took notice of that an electrode position coating is applied to only an electric conductive member with high accuracy to form an effective light shielding film and that it is soluble in an appropriate reagent. As a result, the present invention has been achieved on the basis of a very unique idea that a light shielding electrodeposition coating is first formed on a transparent electric conductive circuit pattern so as to suppress the reaction of a photo-setting material against light which is to be applied to the electrodeposition coating.

DESCRIPTION OF THE PREFERRED EMBODIMENT

In forming a functional coating film on the spaces of a fine electric conductive circuit pattern, a precoat film having a light shielding property and reagent solubility is applied solely on the electric conductive circuit pattern. The entire transparent base board including the precoat film is next coated with a functional material which is capable of forming a functional coating film provided with photo-curability. After this functional coating film is prebaked by an appropriate method and under an appropriate condition as occasion demands the back surface of the transparent base board, namely, the surface provided with no electric conductive pattern is irradiated with light to cure the photo-setting material. At this time, at the portion with the precoat film formed thereon by electrode position, the photo-setting material coated on the precoat film is not cured, because light is screened by the light-screening property thereof. That is, light curing operation progresses only on the spaces of the electric conductive circuit pattern on which no precoat film is formed.

The uncured portions of the photo-setting material and the light-shielding precoat film formed by electrodeposition are then removed by using a proper reagent, thereby leaving the functional material on the spaces of the electric conductive circuit pattern. The remaining functional material is postbaked or irradiated with UV as occasion demands, whereby enabling a functional coating film having a predetermined function to be formed solely on the spaces of the electric conductive circuit pattern on the transparent base board with high accuracy.

The above-described structure of the present invention will be explained in detail in the following.

In the first step, a coating agent having a light-shielding property and reagent solubility is electrodepositioned on the electric conductive circuit pattern to form a light-shielding precoat film.

As a substrate of a color filter, a transparent base board is preferably used in the present invention. The material of the base board is glass or plastic. The material of the electric conductive circuit pattern is an ITO film (tin-doped indium oxide) or a NESA film aantimony-doped tin oxide).

A method of electrode position on the circuit is a generally known electrode position coating method. Both of the anionic electrode position coating and the cationic electrode position coating may be usable, but the former as preferable in consideration that it has little influence on the circuit and facilitates removal. The material for electrodeposition coating is a resin material such as a maleic oil, acrylic, polyester, polybutadiene, or polyolefin resin material may be. Either one material selected from the above list mixed material may be used. An appropriate amount of pigment, for providing a light-screening property or other light-shielding materials, are mixed in a binder of these resins. The electrodeposition liquid is generally diluted by water. Into this liquid, a transparent base board, provided with an electric conductive circuit pattern to be coated by electrode position and an anticorrosive electric conductive materials such as stainless steel, are inserted as counter-electrodes. If an anionic electrode position is used, DC current is applied with the electric conductive circuit pattern as positive, whereby the current flows to the counter-electrode and simultaneously applies the coating agent onto the electric conductive circuit pattern. The necessary film thickness is controlled by electrode position conditions. The electrode position is generally conducted at 10–300 V for 1 sec. to 3 min. Non-aqueous electrode position material, which uses an organic solvent, may be used in place of the above-described water-diluted material. The electrode position material is washed adequately to remove unnecessary substances after the film formation, and is prebaked, if necessary, to obtain a film strength of a certain extent.

In the second step, a functional material having the photo-curability is applied to form a functional coating film. For this purpose, a method for producing a comparatively uniform coating film such as spin coating, roll coating, offset printing or dip coating is used. As a functional material having photo-curability, called (i.e., a UV-cured type material, which shows curing reaction in the UV region) is preferable in terms of facility. The main components of the UV-cured material are acrylic, urethane, epoxy, synthetic rubber and polyvinyl alcohol resins, rubber and gelatin. These materials may be used singly or in the form of a mixture. They are commercially available as a photo-setting type coating, ink and a negative type resist. It is preferable to appropriately add a reactive diluent, a reaction initiator, a light sensitizing agent, etc. to promote reaction. A necessary additive may be added in accordance with the function to be obtained. For example, a proper pigment or a light-shielding agent is used for the purpose of light shielding. A proper material for improving the adhesive force is used when the function for adhesion is required. When the photo-setting agent is applied, it is diluted to an appropriate viscosity or solid content by a proper organic solvent such as hydrocarbon, ester and ketone in the case of an organic solvent dilution type material, and by water in the case of a water dilution type material, in order to improve the coating workability.

In the third step, the back surface of the transparent base board is exposed to light. Before the light-exposure step, a diluent is dispersed in the applied functional material having photo-curability and the functional material is prebaked, if necessary, to strengthen it. The light-exposure step is next executed.

Light of various ranges is usable in accordance with the kind of the functional material. Light in the UV range is generally preferable and an apparatus using an ultra-high-pressure mercury lamp, a metal halide lamp or the like is usable as the light source.

The exposure condition is different depending upon the quantity of light to be used and the kind of the functional material, but it is generally about 0.1 sec. to 60 sec. In the exposed portion crosslinking reaction proceeds and the portion is insolubilized.

The fourth step is a step for removing the uncured portions of the photo-setting coating film and the light-shielding precoat film. They are removed by bringing them into contact with a reagent having a power for solving the coating film, e.g., a developer. They are brought into contact with a reagent by dipping, showering, etc., for about 30 sec. to 5 min. Various reagents may be selected in accordance with the used light-shielding precoat film and the photo-setting coating film, and alkaline water solutions such as caustic soda and sodium carbonates and organic solvents such as ester, ketone, alcohol and chlorinated hydrocarbon are generally appropriately used. In this step, the uncured photo-setting coating film and the light-shielding film are removed, so that only the functional film necessary for filling the electric conductive circuit pattern is finally removed. The coating film is sufficiently washed with water, an organic solvent or the like, and is post-baked, if necessary, to obtain the required function.

The present invention will be described hereinunder in more detail with reference to the following examples.

The materials used are as follows:

1. Transparent circuit board: On the glass board of 1.1 mm thick, ITO circuits (60μ/square) of 200μ wide were formed at an interval of 40μ on the parallel lines pitch).

2. Coating agent having a light-shielding property and reagent-solubility (A) Aqueous solution of a surfactant L (SAICSEN produced by Seitetsu Kagaku Kogyo Co., Ltd) with carbon black dispersed therein. Solid content 10% by weight.

(B) Aqueous solution of maleic oil polyester resin water solution with titanium white and carbon black dispersed therein (ESBIA TS #5000: produced by Shinto Toryo). Solid content 12% by weight.

3. Photo-setting functional material (A) Cyclohexanone liquid containing 10 % by weight acrylic photo-curable resin (produced by Fuji Chemical Industries (FVR)) with an aniline black dye dissolved therein.

(B) Xylol liquid containing 15% by weight of solid content including acrylic photo-curable resin (ARONIX UV#3351: produced by Toa Gosei Chemical Industry Co., Ltd.) and 2% by weight (in the ratio of solid content) of initiator (IRGACURE #907).

EXAMPLE 1

Formation of coating film having a light-shielding function:

(i) Formation of a light-shielding precoat film:

A coating film was formed by using the coating agent (B) on the circuit of a base board by electrode position. After adequate washing, the coating film was prebaked at 70° C. for 10 minutes. The thickness of the coating film was 2μ, and the light screening ratio was 98%. Electrode position was performed under the conditions of 30° C., 50 V and 10 seconds.

(ii) Formation of a photo-setting coating film:

The photo-curable function material (A) was applied by a spinner to the base board which had been subjected to the step (i) at a speed of 1,000 rpm. After the application, the coating film was prebaked at 100° C. for 10 minutes. The thickness of the film was 1.2μ, and the light screening ratio was 90%.

(iii) Light exposure

The back surface (the surface opposite to the surface provided with the circuit pattern) of the base board subjected to the step (ii) was irradiated with the UV light beam of 80W from a distance of 10 cm for 10 seconds.

(iv) Dissolving out and curing

The base board was immersed in FVL developer (produced by Fuji Chemical Industries) for 2 minutes to dissolve out and remove the un-exposed portions of the photo-setting coating film and the light-shielding precoat film. After the base board was washed well with isopropyl alcohol and dried, it was baked at 150° C. for 20 minutes.

The remaining film formed a light-shielding film of 1.2μ thick at the portion except on the ITO circuits with high accuracy. This base board is usable as a transparent base board coated with a light-shielding film. It is also possible to use the base board as a color filter coated with a light-shielding film by applying red, green and blue colors to the ITO circuits by electrode position in the next step and coating the three-colored circuit pattern with a light-shielding film to form a color filter having very good optical characteristics.

EXAMPLE 2

Formation of a flat film:

(i) Formation of a light-shielding precoat

A coating film was formed on the circuit of the base board by using the coating agent (A). After the base board was washed well with water, the coating film was prebaked at 50° C. for 15 minutes. The thickness of the coating film was 2μ, and the light-shielding ratio was 99%.

(ii) Formation of a photo-setting film:

The photo-curable function material (B) was applied by a spinner to the base board which had been subjected to the step (i) at a speed of 800 rpm. After the application, the coating film was prebaked at 70° C. for 10 minutes. The thickness of the film was 2.0µ, and the light screening ratio was 90%.

(iii) Light exposure

The back surface of the base board subjected to the step (ii) was irradiated with the UV light beam of 80W from a distance of 10 cm for 4 seconds.

(iv) Dissolving out and curing

The base board was immersed in 1% caustic soda solution at 70° C. for 3 minutes to dissolve out and remove the uncured portions of the photo-setting coating film and the light-shielding precoat film. After the base board was washed well with pure water and dried, it was irradiated with UV light of 80W for 2 seconds from a distance of 10 cm. A film of 2.0µ thick was formed except on the ITO circuits with high accuracy. It was possible to form a flat three-color filter on the base board by applying red, green and blue colors to the ITO circuits by electrode position in the next step.

Since this color filter had a flat configuration, it is easy to further form a functional film such as an electric conductive film thereon.

According to a method of the present invention, it is possible to form a functional coating film on the spaces of an electric conductive circuit pattern on a transparent base board economically and with high accuracy. If, for example, this method is applied to the formation of a light-shielding film on the spaces of the color stripes of a three-color filter for a liquid crystal display with a coloring layer formed thereon by electrode position, it is possible to produce a color filter having very good optical characteristics.

What is claimed is:

1. (Four Times Amended) A method of forming a functional coating film on spaces of a fine electric conductive circuit pattern of a transparent base board comprising the steps of:
   (i) forming a light-shielding precoat film on said electric conductive circuit pattern by electrode position of a coating agent having a light-shielding property and reagent solubility;
   (ii) forming a photo-setting coating film by applying a functional material having photo-curability to an entire part of said transparent base board including said precoat film;
   (iii) exposing a back surface of said transparent base board to light for curing portions of said photo-setting coating film which are not shielded by said light-shielding precoat film; and
   (iv) removing the uncured portions of said photo-setting coating film, which has been un-exposed in the step (iii), and said light-shielding precoat film, formed in the step (i), with the same reagent in a single process.

2. A method according to claim 1, wherein said electric conductive circuit pattern is formed of a transparent electrode.

3. A method according to claim 1, wherein said photo-setting coating film, formed on said transparent base board is a functional coating film having a light-screening property.

* * * * *